United States Patent
Liu et al.

(10) Patent No.: US 9,666,609 B2
(45) Date of Patent: May 30, 2017

(54) ARRAY SUBSTRATE WIRING AND THE MANUFACTURING AND REPAIRING METHOD THEREOF

(71) Applicant: BOE TECHNOLOGY GROUP CO., LTD., Beijing (CN)

(72) Inventors: Chao Liu, Beijing (CN); Yujun Zhang, Beijing (CN); Zengsheng He, Beijing (CN); Lei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/469,554

(22) Filed: Aug. 26, 2014

(65) Prior Publication Data

US 2015/0348994 A1 Dec. 3, 2015

(30) Foreign Application Priority Data

May 29, 2014 (CN) .......................... 2014 1 0234264

(51) Int. Cl.
*H01L 27/12* (2006.01)

(52) U.S. Cl.
CPC ........ *H01L 27/124* (2013.01); *H01L 27/1259* (2013.01)

(58) Field of Classification Search
None
See application file for complete search history.

(56) References Cited

U.S. PATENT DOCUMENTS

2001/0006765 A1* 7/2001 Lee .................. G02F 1/1368
430/318
2001/0013910 A1* 8/2001 Ahn et al. ................. 349/54
(Continued)

FOREIGN PATENT DOCUMENTS

CN 1385827 12/2002
CN 1527268 9/2004
(Continued)

OTHER PUBLICATIONS

Chinese Office Action with English Language Translation, dated Feb. 15, 2016, Chinese Application No. 201410234264.3.
(Continued)

*Primary Examiner* — Shaun Campbell
*Assistant Examiner* — Aneta Cieslewicz
(74) *Attorney, Agent, or Firm* — Blakely Sokoloff Taylor & Zafman LLP

(57) ABSTRACT

This disclosure relates to an array substrate wiring and manufacturing and repairing method thereof. The array substrate wiring comprises a first wiring formed on the substrate for transmitting electric signals; an insulating layer formed on the first wiring; a second wiring formed on the insulating layer, being opposite to the first wiring, the second wiring being in a hanging state and not transmitting electric signals. By means of such a double layer wiring structure, the holes produced in the insulating layer are blocked using the second wiring in the upper layer, such that the outside moisture cannot reach the first wiring via the holes in the insulating layer, thereby protecting the first wiring for transmitting electric signals from corrosion and scratch.

13 Claims, 4 Drawing Sheets

(56) References Cited

U.S. PATENT DOCUMENTS

| | | | |
|---|---|---|---|
| 2004/0031991 A1* | 2/2004 | Jang | H01L 27/12 |
| | | | 257/347 |
| 2013/0092946 A1 | 4/2013 | Ma et al. | |
| 2015/0053461 A1* | 2/2015 | Liou et al. | 174/251 |

FOREIGN PATENT DOCUMENTS

| | | |
|---|---|---|
| CN | 101086564 | 12/2007 |
| CN | 101093333 | 12/2007 |
| CN | 102998869 | 3/2013 |
| CN | 203563285 | 4/2014 |
| WO | WO-2014026321 | 2/2014 |

OTHER PUBLICATIONS

Office Action in Chinese Application No. 201410234264.3 dated Jun. 15, 2016, and English translation. 12 pages.
Office Action in Chinese Application No. 201410234264.3 dated Dec. 12, 2016, with English translation. 18 pages.

* cited by examiner

ARRAY SUBSTRATE WIRING AND THE MANUFACTURING AND REPAIRING METHOD THEREOF

TECHNICAL FIELD

The present disclosure relates to the field of display technology, and specifically relates to an array substrate wiring and manufacturing and repairing method thereof.

BACKGROUND ART

There is a scan line wiring area formed in synchronization with a gate metal layer and a data line wiring area formed in synchronization with a source drain metal layer in the periphery of a thin film transistor liquid crystal display (TFT-LCD) or an organic electroluminescent display (OELD). FIG. 1 shows a schematic plan view of an array substrate of the prior art. As shown in FIG. 1, the scan line wiring is indicated by solid lines, the data line wiring is indicated by hollow lines, wherein the scan line wiring is not formed in synchronization with the data line wiring, but is located in a different layer.

In the manufacturing process flow of the prior art, the problem of wiring scratch and corrosion often comes up. The scratch generally occurs in the cutting process of the display unit, and particularly, for the wiring area is exposed, it is quite easily scratched by glass debris or other foreign matters; while the corrosion is generally caused because an insulating layer is destroyed by the scratch or the membrane is not dense enough at the slope of the insulating layer and has holes, thus it is easy to result in corrosion of the wiring. FIG. 2 and FIG. 3 show sectional views of the scan line wiring area and the data line wiring area of the array substrate of the prior art respectively. As shown in FIG. 2, in the scan line wiring area, a scan line wiring 12 is formed on a substrate 11, the scan line wiring 12 is covered with a gate insulating layer 13 and a passivation layer 14, and the gate insulating layer 13 and the passivation layer 14 have holes 16 at the slopes because the membrane is not dense enough. As shown in FIG. 3, in the data line wiring area, a gate insulating layer 13 is formed on the substrate 11, a data line wiring 15 is formed on the gate insulating layer 13, and the data line wiring 15 is covered with the passivation layer 14, the passivation layer 14 also has holes 16 at the slope because the membrane is not dense enough, thus it is easy for moisture and the like to enter through the holes 16 so as to generate electrochemical reactions quickly and result in corrosion and open of the wiring, such that bright lines are generated.

If the scratch or the corrosion results in open of the wiring, it will directly cause the display panel to generate bright lines when it is lightened, so as to result in discard of the substrate; if the above wiring damage or corrosion has not resulted in open of the wiring at the factory, these problems may possibly become worse at the client, especially in the case of working with electricity in the environment of high temperature and high humidity, since moisture and the like enter through the holes so as to generate electrochemical reactions quickly and result in corrosion and open of the wiring, it results in generation of bright lines.

SUMMARY

The technical problem to be solved by the present disclosure is how to avoid or mitigate scratch and corrosion happened to the array substrate wiring.

According to one aspect of the present disclosure, an array substrate wiring is proposed, comprising: a first wiring formed on the substrate for transmitting electric signals; an insulating layer formed on the first wiring; a second wiring formed on the insulating layer, the second wiring being opposite to the first wiring, being in a hanging state, and not transmitting electric signals. Thus, by means of such a double layer wiring structure, the holes produced in the insulating layer are blocked using the second wiring in the upper layer, such that the outside moisture cannot reach the first wiring via the holes in the insulating layer, thereby protecting the first wiring for transmitting electric signals from corrosion and scratch In an embodiment of the array substrate wiring according to the present disclosure, the line width of the second wiring is greater than the line width of the first wiring, such that it covers the first wiring entirely, thereby enabling the protection effect of the first wiring better.

In an embodiment of the array substrate wiring according to the present disclosure, the first wiring comprises a scan line wiring located in a scan line wiring area and a data line wiring located in a data line wiring area; and the second wiring comprises a scan line protection wiring located in the scan line wiring area and a data line protection wiring located in the data line wiring area. Wherein the scan line wiring can be formed in synchronization with a gate metal layer, the scan line protection wiring can be formed in synchronization with a source drain metal layer; and the data line wiring can be formed in synchronization with the source drain metal layer, the data line protection wiring can be formed in synchronization with a transparent electrode layer.

In an embodiment of the array substrate wiring according to the present disclosure, the first wiring is formed in synchronization with a gate metal layer, and the second wiring is formed in synchronization with a source drain metal layer; or the first wiring is formed in synchronization with a gate metal layer, and the second wiring is formed in synchronization with a transparent electrode layer; or the first wiring is formed in synchronization with a source drain metal layer, and the second wiring is formed in synchronization with a transparent electrode layer.

In an embodiment of the array substrate wiring according to the present disclosure, the array substrate wiring further comprises at least one protection wiring formed on the first wiring, being opposite to the first wiring and electrically insulated from the first wiring, the at least one protection wiring being in a hanging state and not transmitting electric signals. In this way, a wiring structure of three layers or more layers can be formed, so as to further improve the anti-scratch and anti-corrosion capability of the signal transmitting wiring. The above at least one protection wiring may be formed in synchronization with the transparent electrode layer, and the line width of the above at least one protection wiring may be greater than the line width of the first wiring.

In an embodiment of the array substrate wiring according to the present disclosure, the data line wiring located in the data line wiring area is electrically connected with the source drain metal layer.

In an embodiment of the array substrate wiring according to the present disclosure, the data line wiring located in the data line wiring area is connected with the source drain metal layer through the via holes on the insulating layer, or the data line wiring located in the data line wiring area is connected with the source drain metal layer through the transparent electrode layer.

According to a second aspect of the present disclosure, a method of manufacturing an array substrate wiring is proposed, comprising: forming a first wiring for transmitting electric signals on a substrate; forming an insulating layer on the first wiring; forming a second wiring on the insulating layer, the second wiring being opposite to the first wiring, being in a hanging state, and not transmitting electric signals.

In an embodiment of the method of manufacturing an array substrate wiring according to the present disclosure, the method further comprises forming at least one protection wiring, the at least one protection wiring being formed on the first wiring, opposite to the first wiring and electrically insulated from the first wiring, and the at least one protection wiring being in a hanging state and not transmitting electric signals.

According to a third aspect of the present disclosure, a method of repairing an array substrate wiring according to the present disclosure is proposed, comprising: when the first wiring being in an open state, electrically communicating the first wiring with the second wiring so as to enable the second wiring to transmit electric signals.

According to a fourth aspect of the present disclosure, an array substrate comprising an array substrate wiring according to the present disclosure is proposed.

According to a fifth aspect of the present disclosure, a display panel comprising an array substrate according to the present disclosure is proposed.

According to a sixth aspect of the present disclosure, a display device comprising a display panel according to the present disclosure is proposed.

By using the array substrate wiring disclosed in the present disclosure and the manufacturing and repairing method thereof, as well as an array substrate, a display panel and a display device comprising such an array substrate wiring, in such a multilayer wiring structure, an upper layer protection wiring is used to block the outside moisture from reaching the signal transmission wiring via the holes in the insulating layer so as to reduce and even avoid its corrosion to the signal transmission wiring, moreover, the signal transmission wiring can be protected from being scratched, and the signal transmission wiring can also be repaired conveniently when it is in an open state.

BRIEF DESCRIPTION OF THE DRAWINGS

The features and advantages of the present disclosure can be understood more clearly by referring to the drawings, and the drawings are schematic and should not be understood as any limitation to the present disclosure, in the drawings.

DETAILED DESCRIPTION OF EMBODIMENTS

Thereinafter, the embodiments of the present disclosure will be described in detail in conjunction with the drawings. In the following specific embodiments, the scan line wiring and the data line wiring that transmit electric signals can be equivalent to the first wiring, the scan line protection wiring and the data line protection wiring can be equivalent to the second wiring.

Figure 1:
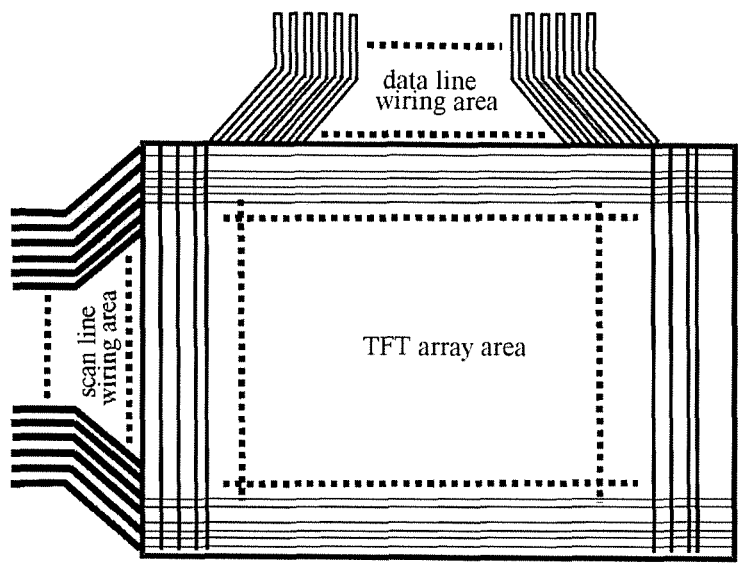
FIG. 1 shows a schematic plan view of an array substrate of the prior art.
Figure 2:
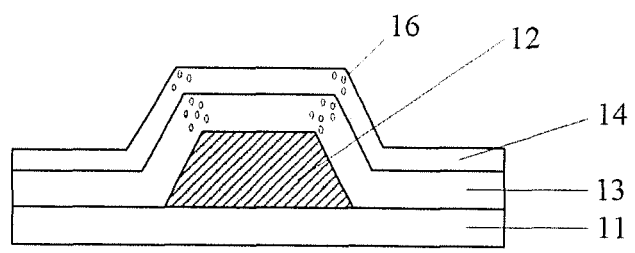
FIG. 2 shows a sectional view of a scan line wiring area of the array substrate of the prior art.
Figure 3:
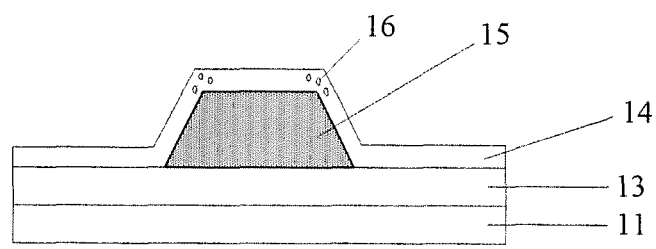
FIG. 3 shows a sectional view of a data line wiring area of the array substrate of the prior art.
Figure 4:
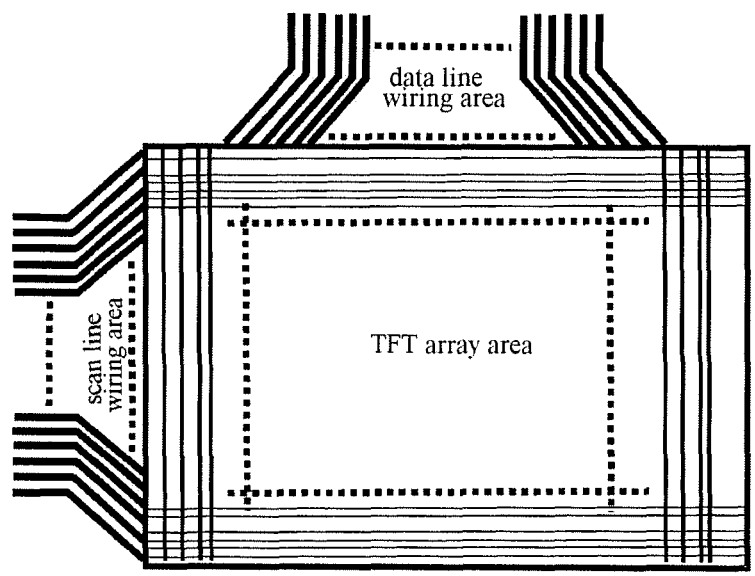
FIG. 4 shows a schematic plan view of an array substrate according to one embodiment of the present disclosure.

FIG. 4 shows a schematic plan view of an array substrate according to one embodiment of the present disclosure. The difference between the array substrate of the prior art as shown in FIG. 1 and the array substrate as shown in FIG. 4 lies in that the scan line wiring of the array substrate as shown in FIG. 4 is formed in synchronization with the data line wiring, hence, the scan line wiring and the data line wiring in FIG. 4 are both indicated by solid lines. Hereinafter, in order to describe clearly, the same metal layer is indicated by the same reference number, while different elements formed in the same metal layer are distinguished by a, b. For example, the scan line wring and the data line wiring are both formed in the step of forming the gate metal layer, hence, the scan line wiring is indicated by 22a, the data line wiring is indicated by 22b; the protection wiring is formed in the step of forming the source drain metal layer, hence, the source drain metal layer is indicated by 25, the scan line protection wiring in the scan line wiring area is indicated by 25a, the data line protection wiring in the data line wiring area is indicated by 25b.

Figure 5A:
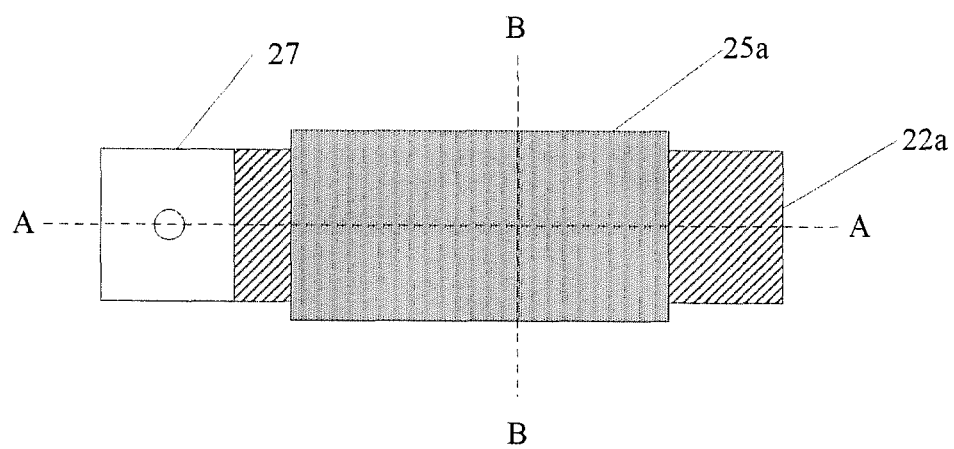
FIG. 5A shows a schematic plan view of a scan line wiring area of the array substrate according to one embodiment of the present disclosure.
Figure 5B:
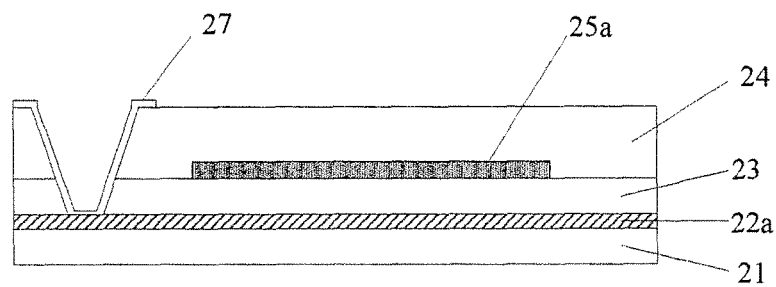
FIG. 5B shows a sectional view along line A-A in FIG. 5A.
Figure 5C:
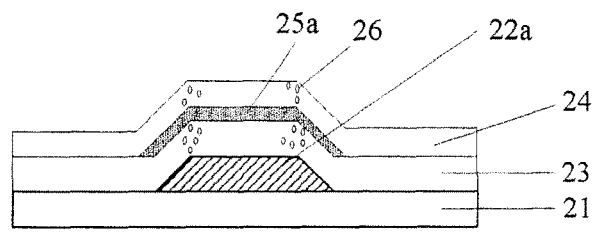
FIG. 5C shows a sectional view along line B-B in FIG. 5A.

FIG. 5A shows a schematic plan view of a scan line wiring area of the array substrate according to one embodiment of the present disclosure. FIGS. 5B and 5C respectively show sectional views along line A-A and line B-B in FIG. 5A. In this embodiment, in the scan line wiring area, the scan line wiring is formed in synchronization with the gate metal layer, which is the same as the prior art, hence, the structures of the scan line wring and the gate metal layer are the same as the prior art. As shown in FIG. 5B, a scan line wiring 22a is formed on a substrate 21, a gate insulating layer 23 is formed on the scan line wiring 22a, a passivation layer 24 is formed on the gate insulating layer 23, and a transparent electrode layer 27 is connected with the scan line wiring 22a through via holes in a bonding area. In this embodiment, the difference from the prior art lies in that above the scan line wiring 22a of the scan line wiring area, there is also a scan line protection wiring 25a formed in synchronization with the source drain metal layer, as shown in FIGS. 5A-5C. Moreover, as shown in FIG. 5A, the line width of the scan line protection wiring 25a is greater than the line width of the scan line wiring 22a, so as to be capable of covering the scan line wiring 22a entirely. As shown in FIGS. 5B and 5C, the scan line protection wiring 25a is in a hanging state and will not transmit electric signals. From FIG. 5C it can be seen clearly that the scan line protection wiring 25a formed in synchronization with the source drain metal layer covers the scan line wiring 22a entirely, thereby protecting the scan line wiring 22a from being scratched. Furthermore, the metal material of the scan line protection wiring 25a is quite dense, thereby blocking holes 26 produced in the gate insulating layer 23 and the passivation layer 24, such that the outside moisture cannot reach the scan line wiring 22a via the holes 26 produced in the gate insulating layer 23 and the passivation layer 24 so as to protect the scan line wiring 22a from corrosion.

Figure 6A:
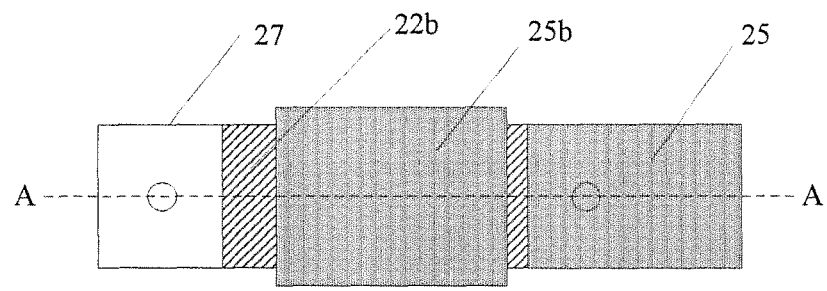
FIG. 6A shows a schematic plan view of a data line wiring area of the array substrate according to one embodiment of the present disclosure.
Figure 6B:
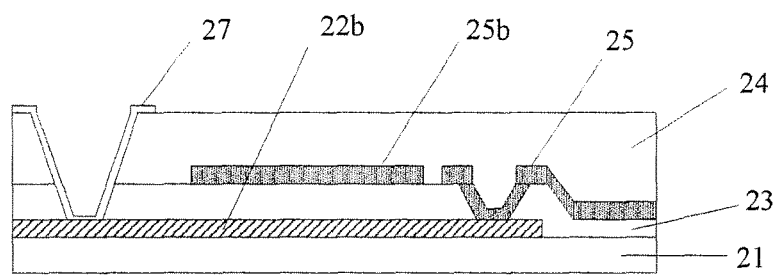
FIG. 6B shows a sectional view along line A-A in FIG. 6A.

FIG. 6A shows a plan schematic view of a data line wiring of the array substrate according to one embodiment of the present disclosure. FIG. 6B shows a sectional view along line A-A in FIG. 6A. As shown in FIGS. 6A and 6B, in the data line wiring area, a data line wiring 22b is formed in synchronization with the gate metal layer, therefore, in order to connect the data line wring 22b with the source drain metal layer 25 so as to realize the function of the data line wiring, there is a need to form via holes in the gate insulating layer 23 on an end of the data line wring 22b close to the array substrate area, so as to electrically connect the data line wiring 22b with the source drain metal layer 25. A data line protection wiring 25b is formed above the data line wiring 22b of the data line wiring area while forming the source drain metal layer 25. As shown in FIGS. 6A and 6B, the data line protection wiring 25b is in a hanging state, and its line width is greater than that of the data line wiring 22b, so as to be capable of covering the data line wiring 22b entirely, hence, based on the same principle as the protection principle of the scan line wiring area as shown in FIGS. 5A-5C, the data line wiring 22b is protected from corrosion or scratch.

Figure 7:
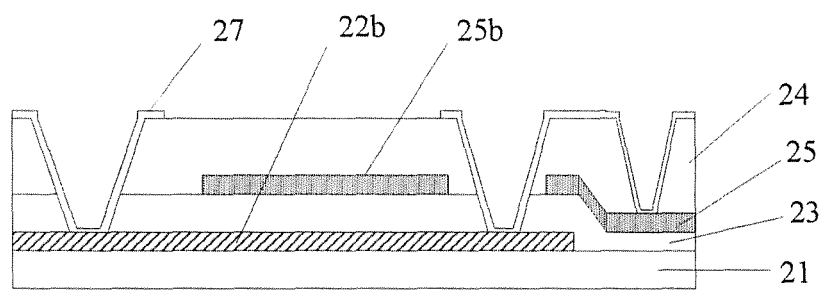
FIG. 7 shows a sectional view of a data line wiring area of the array substrate according to another embodiment of the present disclosure.

FIG. 7 shows a sectional view of a data line wiring area of the array substrate according to another embodiment of the present disclosure. From the comparison with the sectional view of a data line wiring area in FIG. 6B, it can be seen that the difference between FIG. 7 and FIG. 6B lies in that the data line wiring 22b is connected in a different way with the source drain metal layer 25. Specifically, in the embodiment as shown in FIG. 6B, there is a need to form via holes in the gate insulating layer 23 on an end of the data line wring 22b close to the array substrate area, so as to electrically connect the data line wiring 22b with the source drain metal layer 25; while in the current embodiment, at the time of manufacturing a transparent electrode layer 27, the transparent electrode layer 27 is used to electrically connect the data line wiring 22b with the source drain metal layer 25, thereby no longer needing the process of forming via holes on the gate insulating layer 23 within the data line wiring area individually, thus a masking process is reduced.

The present disclosure further proposes a method of manufacturing an array substrate wiring, comprising: forming a first wiring for transmitting electric signals on the substrate; forming an insulating layer on the first wiring; forming a second wiring for protecting the first wiring on the insulating layer, the second wiring being opposite to the first wiring, in a hanging state, and not transmitting electric signals. In the following embodiment, the first wiring may be a scan line wiring and a data line wiring that transmit electric signals, while the second wiring may be a scan line protection wiring and a data line protection wiring.

Hereinbelow, the method of manufacturing a substrate wiring area according to an embodiment of the present disclosure will be described specifically by referring to FIGS. 5A-5C and FIGS. 6A-6B, the method comprises steps of:

Step S1: depositing a gate metal layer;

Step S2: patterning the gate metal layer so as to form a scan line wiring 22a in the scan line wiring area and form a data line wiring 22b in the data line wiring area;

Step S3: forming a gate insulating layer 23 on the gate metal layer and patterning the gate insulating layer 23;

Step S4: forming an active layer on the gate insulating layer 23, wherein the active layer only exists in the array substrate area;

Step S5: forming via holes on the gate insulating layer 23 within the data line wiring area;

Step S6: forming a source drain metal layer 25 on the gate insulating layer 23;

Step S7: patterning the source drain metal layer 25 so as to form a scan line protection wiring 25a in the scan line wiring area and form a data line protection wiring 25b in the data line wiring area;

Step S8: forming a passivation layer 24 on the source drain metal layer 25;

Step S9: forming a transparent electrode layer 27 on the passivation layer 24.

Thus the manufacturing process of the wiring areas according to the embodiment of the present disclosure is accomplished.

The present disclosure further proposes a method of repairing an array substrate wiring, comprising: when the first wiring being in an open state, electrically communicating the first wiring with the second wiring, so as to enable the second wiring to transmit electric signals. Since the second wiring for protecting the first wiring and the first wiring are mutually independent, when the signal wiring (the first wiring) of the lower layer is in an open state, the protection wiring (the second wiring) can be electrically communicated with the signal wiring of the lower layer through the laser welding technology, so as to repair the signal wiring.

The embodiments of the present disclosure are described as above by way of examples, but they are not limitations to the present disclosure. The skilled person in the art should understand that it is feasible either forming the first wiring in synchronization with the gate metal layer and forming the second wiring in synchronization with the transparent electrode layer, or forming the first wiring in synchronization with the source drain metal layer and forming the second wiring in synchronization with the transparent electrode layer. Specifically, in the event that the first wiring comprises a scan line wiring located in the scan line wiring area and a data line wiring located in the data line wiring area and the second wiring comprises a scan line protection wiring located in the scan line wiring area and a data line protection wiring located in the data line wiring area: enabling the scan line wiring and the data line wiring to be formed in synchronization with the gate metal layer, and enabling the scan line protection wiring and the data line protection wiring to be formed in synchronization with the transparent electrode layer; or enabling the scan line wiring and the data line wiring to be formed in synchronization with the source drain metal layer, and enabling the scan line protection wiring and the data line protection wiring to be formed in synchronization with the transparent electrode layer. As for the case that the first wiring is formed in synchronization with the gate metal layer and the second wiring is formed in synchronization with the source drain metal layer, the gate insulating layer serves as the insulating layer between these two wirings; as for the case that the first wiring is formed in synchronization with the source drain metal layer and the second wiring is formed in synchronization with the transparent electrode layer, the passivation layer between the source drain metal layer and the transparent electrode layer serves as the insulating layer between the first wiring and the second wiring; and as for the case that the first wiring is formed in synchronization with the gate metal layer and the second wiring is formed in synchronization with the transparent electrode layer, one or both of the gate insulating layer and the passivation layer can be chosen as the insulating layer.

The preceding embodiments are all on the basis that the scan line wiring in the scan line wiring area and the data line wiring in the data line wiring area are made of the same metal layer. Of course, the embodiments of the present disclosure are not limited to the case that the scan line wiring and the data line wiring are made of the same metal layer. For example, the scan line wiring can be formed in synchronization with the gate metal layer while the data line wiring is formed in synchronization with the source drain metal layer, each of the two is the first wiring for transmitting electric signals; corresponding to the above case, the scan line protection wiring can be formed in synchronization with the source drain metal layer or in synchronization with the transparent electrode layer, and the data line protection wiring can be formed in synchronization with the transparent electrode layer, both of them serve as the second wiring.

The skilled person in the art, based on the teaching of the present disclosure, can also think of making improvement to the array substrate wiring in the prior art directly, taking the scan line wiring and the data line wiring formed in synchronization with the gate metal layer and the source drain metal layer respectively as the first wirings, i.e., there are two first wirings, here the protection wirings of the two first wirings can be formed at the time of manufacturing the transparent electrode layer. While as for display devices of IPS (In Plane Switching) type and ADS (Advanced Super Dimension Switch) type having two layers of transparent electrodes, one of the transparent electrode layers can also be taken as the protection wiring of one of the two first wirings, and the other transparent electrode layer is taken as the protection wiring of the other of the two first wirings.

The skilled person in the art can also think of that as for a two-layer wiring structure, another layer of protection wiring can be formed on the wiring area, thereby forming a three-layer wiring structure, so as to further improve the anti-scratch and anti-corrosion capability of the signal transmission wiring.

The skilled person in the art can further think of that as for the display devices of IPS type and ADS type having two layers of transparent electrodes, even a four-layer wiring structure can be formed, so as to further improve the anti-scratch and anti-corrosion capability of the signal transmission wiring, or selecting any two or more layers from the gate metal layer, the source drain metal layer, the first transparent electrode layer, and the second transparent electrode layer as the signal transmission wiring and the protection wiring. The skilled person in the art can also assume that as for the case of having more electrically conductive layers, two or more layers can also be selected randomly as the signal transmission wiring and the protection wiring.

The present disclosure further provides an array substrate comprising an array substrate wiring as mentioned above. The present disclosure further provides a display panel comprising an array substrate as mentioned above. Moreover, the present disclosure further provides a display device comprising a display panel as mentioned above, and the display device may be any product or component with the display function, such as a mobile phone, a tablet computer, a TV set, a display, a notebook computer, a digital photo frame, a navigator, etc.

It should be noted that use of the verb "comprise/include" and its conjugations in the claims does not exclude the presence of elements or steps other than those stated in the claims. The word "a" or "an" preceding an element does not exclude the presence of a plurality of such elements.

Although the embodiments of the present disclosure are described by combing with the drawings, the skilled person in the art can make various modifications and variations in the case of not departing from the spirit and scope of the present disclosure, and such modifications and variations all will fall within the scope defined by the attached claims.

The invention claimed is:

1. An array substrate wiring comprising:
   a first wiring formed on an substrate for transmitting electric signals;
   an insulating layer formed on the first wiring;
   a second wiring formed on the insulating layer for protecting the first wiring, being opposite to the first wiring, the second wiring being in a floating state,
   wherein the first wiring comprises a scan line wiring located in a scan line wiring area and a data line wiring located in a data line wiring area, and the second wiring comprising a scan line protection wiring located in the scan line wiring area and a data line protection wiring located in the data line wiring area,
   and wherein the first wiring is formed in synchronization with a gate metal layer, and the second wiring is formed in synchronization with a source drain metal layer, and the data line wiring is connected with the source drain metal layer through a transparent electrode layer.

2. The array substrate wiring according to claim 1, wherein the line width of the second wiring is greater than that of the first wiring.

3. The array substrate wiring according to claim 1, further comprising at least one protection wiring formed on the first wiring, being opposite to the first wiring and being electrically insulated from the first wiring, the at least one protection wiring being in a hanging state and not transmitting electric signals.

4. The array substrate wiring according to claim 2, further comprising at least one protection wiring formed on the first wiring, being opposite to the first wiring and being electrically insulated from the first wiring, the at least one protection wiring being in a hanging state and not transmitting electric signals.

5. The array substrate wiring according to claim 1, further comprising at least one protection wiring formed on the first wiring, being opposite to the first wiring and being electrically insulated from the first wiring, the at least one protection wiring being in a hanging state and not transmitting electric signals.

6. The array substrate wiring according to claim 3, wherein the at least one protection wiring is formed in synchronization with a transparent electrode layer, and the line width of the at least one protection wiring is greater than that of the first wiring.

7. The array substrate wiring according to claim 4, wherein the at least one protection wiring is formed in synchronization with a transparent electrode layer, and the line width of the at least one protection wiring is greater than that of the first wiring.

8. The array substrate wiring according to claim 5, wherein the at least one protection wiring is formed in synchronization with a transparent electrode layer, and the line width of the at least one protection wiring is greater than that of the first wiring.

9. A method of repairing an array substrate wiring according to claim 1, comprising the step of:

when the first wiring being in an open state, electrically communicating the first wiring with the second wiring so as to enable the second wiring to transmit electric signals.

10. An array substrate comprising an array substrate wiring according to claim 1.

11. A display panel comprising an array substrate according to claim 10.

12. A display device comprising a display panel according to claim 11.

13. A method of manufacturing an array substrate wiring comprising the steps of:
   forming a first wiring for transmitting electric signals on an substrate;
   forming an insulating layer on the first wiring;
   forming a second wiring for protecting the first wiring on the insulating layer, the second wiring being opposite to the first wiring, being in a floating state,
   wherein the first wiring comprises a scan line wiring located in a scan line wiring area and a data line wiring located in a data line wiring area, and the second wiring comprising a scan line protection wiring located in the scan line wiring area and a data line protection wiring located in the data line wiring area,
   and wherein the first wiring is formed in synchronization with a gate metal layer, and the second wiring is formed in synchronization with a source drain metal layer, and the data line wiring is connected with the source drain metal layer through a transparent electrode layer.

* * * * *